(12) United States Patent
Sauder et al.

(10) Patent No.: US 6,919,782 B2
(45) Date of Patent: Jul. 19, 2005

(54) FILTER STRUCTURE INCLUDING CIRCUIT BOARD

(75) Inventors: David D. Sauder, Shakopee, MN (US); Teppo Lukkarila, Bloomington, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 377 days.

(21) Appl. No.: 09/826,246

(22) Filed: Apr. 4, 2001

(65) Prior Publication Data

US 2002/0145490 A1 Oct. 10, 2002

(51) Int. Cl.[7] .............................................. H01P 1/20
(52) U.S. Cl. ........................ 333/202; 333/203; 333/230
(58) Field of Search ................................ 333/202, 203, 333/206, 207, 208, 209, 212, 230, 248, 26

(56) References Cited

U.S. PATENT DOCUMENTS

| | | | | |
|---|---|---|---|---|
| 4,477,785 A | * | 10/1984 | Atia | 333/202 |
| 5,382,931 A | * | 1/1995 | Piloto et al. | 333/208 |
| 5,406,236 A | * | 4/1995 | Newell et al. | 333/206 |
| 5,714,919 A | * | 2/1998 | Satoh et al. | 333/202 |
| 5,874,870 A | | 2/1999 | Nishiyama et al. | 333/202 |
| 5,898,349 A | * | 4/1999 | Hattori et al. | 333/202 |
| 6,078,231 A | * | 6/2000 | Pelkonen | 333/203 |

* cited by examiner

Primary Examiner—Stephen E. Jones
(74) Attorney, Agent, or Firm—Fogg and Associates, LLC; Jon M. Powers

(57) ABSTRACT

A cavity filter assembly is provided with at least one structural cavity wall comprising a circuit board. The circuit board may also contain other circuits and circuit elements such as trim capacitors, inductors, low noise amplifier circuits and power amplifiers that are part of the filter's function. Input and output coupling structures and connectors may also be provided on the circuit board. The circuit board may contain inter-stage coupling circuits, signal traces, and coupling pads/structures. Further embodiments are provided that incorporate test connectors and directional couplers on the circuit board. In yet other embodiments the filter's electrical characteristics are tunable with trim elements mounted on the circuit board, such as capacitors or inductors, in either mechanical or electrical manner. The filter's electrical characteristics may also be tunable with mechanical elements mounted through the circuit board.

7 Claims, 5 Drawing Sheets

US 6,919,782 B2

FILTER STRUCTURE INCLUDING CIRCUIT BOARD

TECHNICAL FIELD

The present invention relates generally to the field of communications and, in particular, to a filter structure including a circuit board.

BACKGROUND

Wireless telecommunications systems transmit signals to and from wireless terminals using radio frequency (RF) signals. A typical wireless system includes a plurality of base stations that are connected to the public switched telephone network (PSTN) via a mobile switching center (MSC). Each base station includes a number of radio transceivers that are typically associated with a transmission tower. Each base station is located so as to cover a geographic region known colloquially as a "cell." Each base station communicates with wireless terminals, e.g. cellular telephones, pagers, and other wireless units, located in its geographic region or cell.

A wireless base station includes a number of modules that work together to process RF signals. These modules typically include, by way of example, mixers, amplifiers, filters, transmission lines, antennas and other appropriate circuits. One type of filter that finds increased use in wireless base stations is known as a microwave cavity filter.

Microwave cavity filters generally are formed from a machined, extruded, or cast body structure with enclosing walls to complete the filter cavity structure. The microwave signal generally enters the filter through an input connector and is coupled to an internal coupling pad or structure, and thus inserts it into the cavity structure of the filter. The filtered signal is extracted at the terminal end of the filter with another coupling pad or structure. Structures, such as resonators and/or tuning elements, that affect the electrical characteristics of the filter can be attached internally to the filter. Adjustment of the electrical characteristics of the filter can sometimes require the removal of a filter structural panel in order to gain access to the internally mounted elements.

Additional electronic circuitry, used with the filter is typically contained in one or more assemblies that are separate from the filter structure. This circuitry can include such things as inductors and capacitors to affect the electrical characteristics of the filter, low noise amplifiers (LNA's) and power amplifiers. These elements, being in separate assemblies from the filter body, require the use of connectors and cabling to couple them to the filter. The requirement of separate assemblies, connectors, and cabling can add expense, complexity, and source of undesired signal loss to the filter.

For the reasons stated above, and for other reasons stated below which will become apparent to those skilled in the art upon reading and understanding the present specification, there is a need in the art for a filter with a simpler design and reduced number of components that provides lower costs, less complexity, more reliability, and easier tuning.

SUMMARY

The above mentioned problems with cavity filters and other problems are addressed by embodiments of the present invention and will be understood by reading and studying the following specification.

Embodiments of the present invention provide a filter assembly that includes a circuit board that is attached to the filter assembly as a cover for the cavity allowing electric circuits to be implemented on the circuit board thereby reducing difficulties in connecting the electric circuits to the filter assembly.

More particularly, in one embodiment a filter assembly is provided. The filter assembly includes an enclosure having a cavity wherein at least one wall of the enclosure is comprised of a circuit board. The circuit board includes a trace formed on the circuit board and at least one circuit element coupled to the trace.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

I. Filter Structure

Embodiments of the present invention provide filter assemblies with one or more cavities that are typically formed out of a machined, extruded, or cast body. In addition, one or more structural walls of the filter assembly are formed of a printed circuit board (PCB) material with the remainder of the cavity walls formed in a conventional manner. This arrangement allows circuit elements to be incorporated on the circuit board and simplifies connection to the filter. This simplification saves connectors and cables, and combines all elements of the circuit into one assembly.

Figure 1:
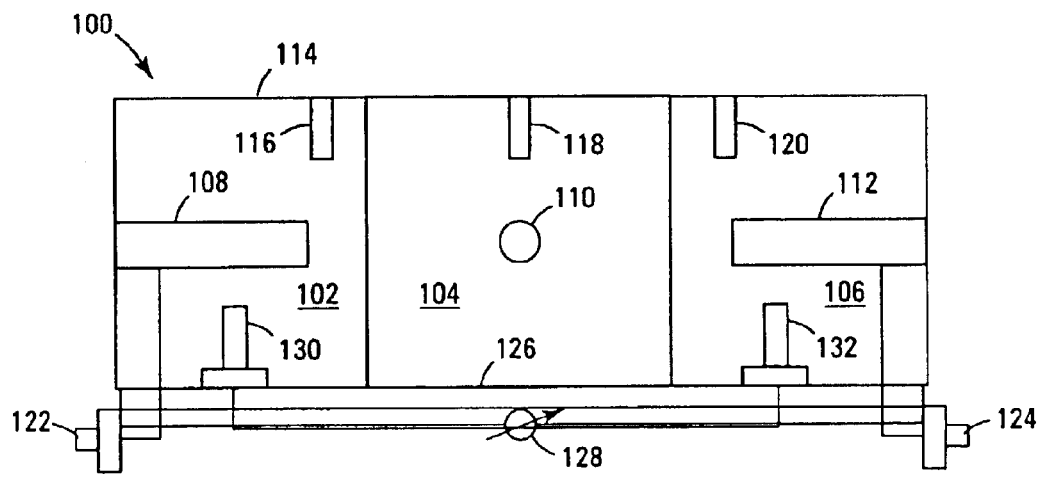
FIG. 1 is a side view that represents an embodiment of a cavity filter assembly according to the teachings of the present invention.

FIG. 1 is a cross sectional, side view that represents an embodiment of a filter assembly, indicated generally at 100, according to the teachings of the present invention. Microwave signals enter the filter assembly 100 through an input connector 122 and are injected into cavity 102 of the filter assembly 100. After having passed through the filter assembly 100, the signal is extracted from the filter assembly 100 and is placed on an output connector 124. The filter assembly 100 is shown with three cavity chambers 102, 104, and 106, that include resonator structures 108, 110, and 112, respectively. In other embodiments, other appropriate numbers of cavity chambers and resonators are used, depending on the filter function that is desired. A first cover plate 114 is shown forming a wall of the filter assembly 100 and contains tuning elements 116, 118, and 120.

A second cover plate 126 of the filter assembly 100 comprises a printed circuit board (PCB). Input connector 122 and the output connector 124 are coupled to filter assembly 100 through second cover plate 126. Advantageously, the second cover plate 126 is adapted to receive additional circuit elements such as inter-stage coupling 128 and coupling pads/structures 130 and 132. In other embodiments, other circuit elements are coupled to the second cover plate 126. For example, additional circuit elements include, in some embodiments, one or more of capacitors, inductors, low noise amplifiers (LNA's), power amplifiers, low pass filters, and the like. This placement of circuits and circuit elements on the second cover plate 126 allows the elimination of separate circuit assemblies, connectors, and cabling to accommodate these elements into the filter assembly. Additionally, inter-stage coupling elements and tuning components are optionally incorporated into the second cover plate 126 to allow the function of the filter assembly 100 to be affected. In any given filter assembly, any one or more of these additional circuit elements can be incorporated.

In the filter assembly 100, a RF signal enters the filter assembly through input connector 122 and is injected into cavity 102 of the filter assembly 100. The RF signal travels through filter cavities 102, 104, and 106 and is filtered. The filtered signal is extracted from the cavity 106 of the filter assembly 100 and is coupled to the output connector 124.

In one embodiment of the filter assembly 100, a filter body is constructed with one or more chambers, having one or more openings in the filter body in various positions. The one or more filter body openings are covered with at least one or more PCB covers. Any remaining openings are covered in a conventional manner to complete the filter structure. The PCB typically will have one or more circuits implemented on it and a ground plane implemented on the surface of the PCB that faces and covers the opening in the body of the filter body assembly. In additional embodiments, multiple circuit trace layers are implemented into the PCB to accommodate more complex circuits.

II. Tuning of the Filter

The characteristics of the filter assembly 100 are electrically adjusted or tuned in a variety of manners. One such manner is by the inclusion of circuit elements on the circuit board 126, such as trimming capacitors and inductors, that affect the electrical characteristics of the filter assembly 100. In one embodiment, these trimming capacitors and inductors are adjusted physically to quickly allow the electrical characteristics of the filter to be tuned to the desired characteristics.

In one embodiment, these tuning elements of the filter are electrically adjustable, allowing for non-mechanical and/or remote adjustment of the electrical characteristics of the filter.

In one embodiment, the filter assembly 100 electrical characteristics are adjusted and/or tuned with mechanical elements wherein the position of the mechanical elements may be adjusted internal to the filter cavities thus changing the characteristics of the filter. For example, filter assembly 100 includes tuning elements which are physically embodied as screws 116, 118, and 120 that extend through the body of the filter assembly allowing for adjustment of the characteristics of each chamber of the filter assembly 100.

III. Printed Circuit Board

Figure 2:
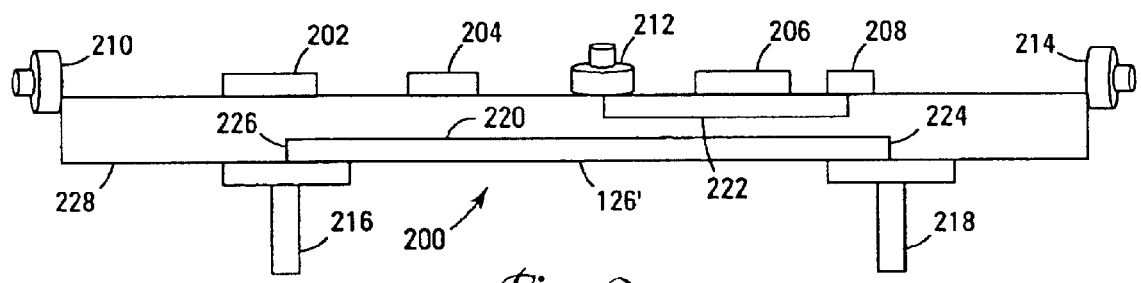
FIG. 2 is a side view that represents a printed circuit board for a cavity filter assembly according to the teachings of the present invention.

FIG. 2 is a cross sectional, side view of one embodiment of a printed circuit board (PCB) 126' suitable for use with the filter assembly 100 of FIG. 1. The PCB 126' is typically formed with a contiguous ground plane 200 on an inner surface 228 that covers an opening of an associated filter assembly body. In one embodiment, circuit elements that are a functional part of the filter assembly are incorporated onto PCB 126' and represented by elements 202, 204, 206, and 208. The PCB 126' of this embodiment is made of conventional materials and processes to form an appropriate circuit board to be used as one wall of a filter assembly. As such, it is possible to construct the PCB 126' of this embodiment with as many circuit layers as necessary to accommodate circuits desired to be used in conjunction with the filter assembly on the PCB 126'. The complexity and cost of such a circuit board are typically related to the number of circuit layers in the PCB 126'. The ability to incorporate circuit elements onto the PCB 126' that forms a structural wall of the filter allows such elements such as low noise amplifiers (LNAs), power amplifiers, and tuning capacitors and inductors to be placed directly onto the wall of the filter assembly. This placement of circuits and circuit elements on the PCB 126' allows the elimination of separate circuit assemblies, connectors, and cabling to accommodate these elements into the filter assembly. Additionally, inter-stage coupling elements and tuning components are optionally incorporated into the PCB 126' to allow the function of the filter assembly to be affected. As shown in FIG. 2, connectors 210, 212, and 214 and coupling pads/structures 216 and 218 are also incorporated into the PCB of the embodiment. Inter-stage coupling in the filter is accomplished in this embodiment with traces etched into the PCB 126'. These etched signal paths are either on a surface or on an internal trace of the PCB 126'. If the signal path/inter-stage coupling line is an internal trace other circuit elements and signal lines could be placed over the top of it on the PCB and do not have to be routed around. Coupling the internal trace 220 with the signal coupling pads/structures 216 and 218 is accomplished with a through layer or "blind" via in the PCB 226 and 224. In one embodiment, additional connector 212 is included on the PCB 126' for electrical connection and communication with the filter and the circuitry on the PCB 126'. This connector allows for easy incorporation of test taps into the PCB 126' and filter assembly of FIG. 2 with devices such as a directional coupler 222.

IV. Directional Couplers

Figure 3:
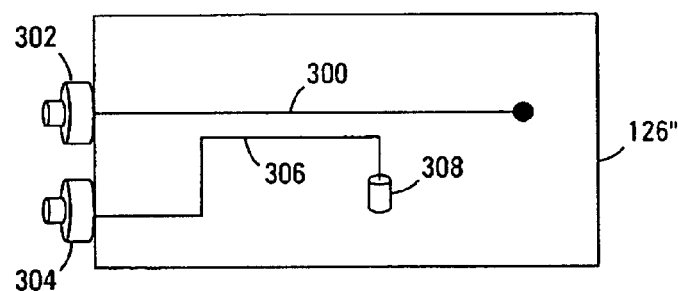
FIG. 3 is a top view that represents a directional coupler according to the teachings of the present invention.

Use of a printed circuit board as a wall of a filter assembly allows test taps and directional couplers to be incorporated without difficulty. Test taps are placed on the PCB and routed through it to coupling pads placed in the appropriate positions in the interior of the filter. Directional couplers can also be incorporated and allow the sensing of the signal at a given point of the filter. Typically, directional couplers are utilized in high frequency RF circuits and filters to allow for an unfiltered signal feed or a mid-point feed in the filter for diagnostic purposes, monitoring, and tuning. FIG. 3 is a top view of a portion of a PCB 126" that shows an example of a directional coupler circuit. A signal line 300 containing a RF signal and a directional coupler, consisting of a signal trace 306, are run parallel to each other in close physical proximity. The RF signal couples from the signal line 300 to the signal trace 306 of the directional coupler. The sampled signal present on the directional coupler signal trace 306 is then coupled externally through the connector 304. The directional coupler is typically terminated with a impedance matching resistor and/or a wavelength tuning stub, shown as element 308. The RF signal is shown as entering the signal line 300 through connector 302, although in other embodiments, the signal is coupled to the signal line 300 through a coupling pad or other such process.

V. Alternative Filter Structures

Figure 4:
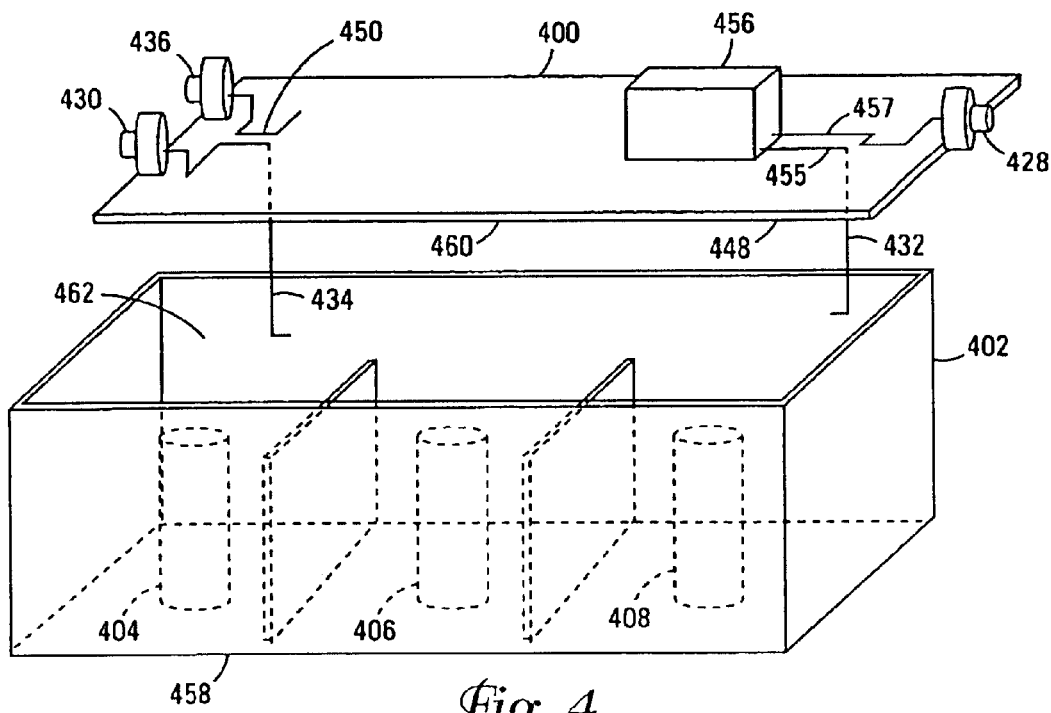
FIGS. 4, 5, and 6 are perspective views that represent embodiments of a cavity filter assembly according to the teachings of the present invention.

FIG. 4 shows a perspective view of an additional embodiment of a filter assembly indicated generally at 458 according to the teachings of the present invention. The filter assembly 458 comprises a filter body 402 with a PCB 400 that forms a cover. The PCB 400 includes a ground plane 448 implemented on the surface 460 covering the opening 462 in the filter body 402. The filter assembly 458 also contains resonators 404, 406, and 408 that are mounted in the filter body 402 or the PCB 400. The filter assembly 458 also has input and output connectors 428 and 430, respectively, and input and output coupling structures 432 and 434 that descend into the filter body 402. An additional connector coupling 436 is provided for a directional coupler 450.

In the filter assembly 458, the RF signal enters the filter assembly 458 through the input connector 430 and is injected into the filter body 402 via the input coupling structure 434. For filter analysis purposes the input RF signal is sampled by the input directional coupler 450 and is made available at connector 436. The filtered RF signal is extracted from the filter body 402 by coupling structure 432, coupling structure 432 is coupled to low noise amplifier (LNA) 456 via trace 455. LNA 456 is further coupled by trace 457 to output connector 428.

Figure 5:
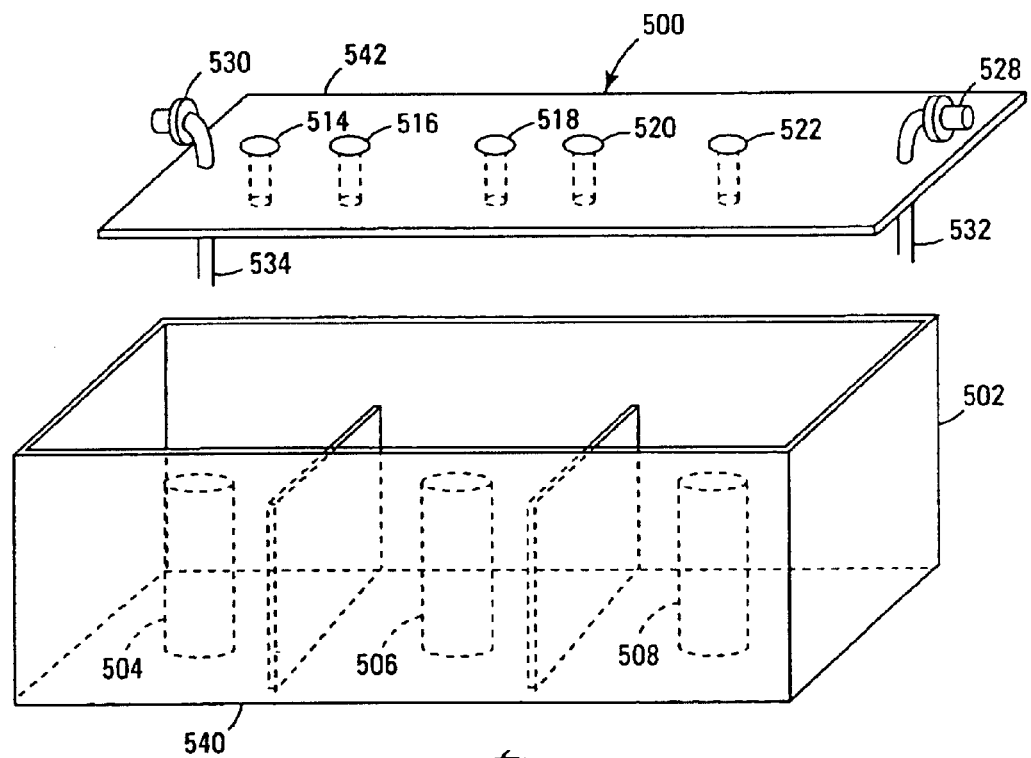

FIG. 5 is a perspective view that represents another embodiment of a filter assembly 540 according to the teachings of the present invention. The filter assembly 540 comprises a filter body 502, a cover 500 that consists of a printed circuit board 542, and resonators 504, 506, and 508 that are mounted in the filter body 502. The filter assembly 540 also has input and output connectors 528 and 530. Connectors 528 and 530 are coupled through the PCB 542 to coupling structures 532 and 534 that descend into the filter body.

In the filter of FIG. 5, adjustment of the filter characteristics is accomplished by tuning elements that are adjusted by screws 514, 516, 518, 520, and 522 that extend through the PCB plate 500 into interior of the filter body.

Figure 6:
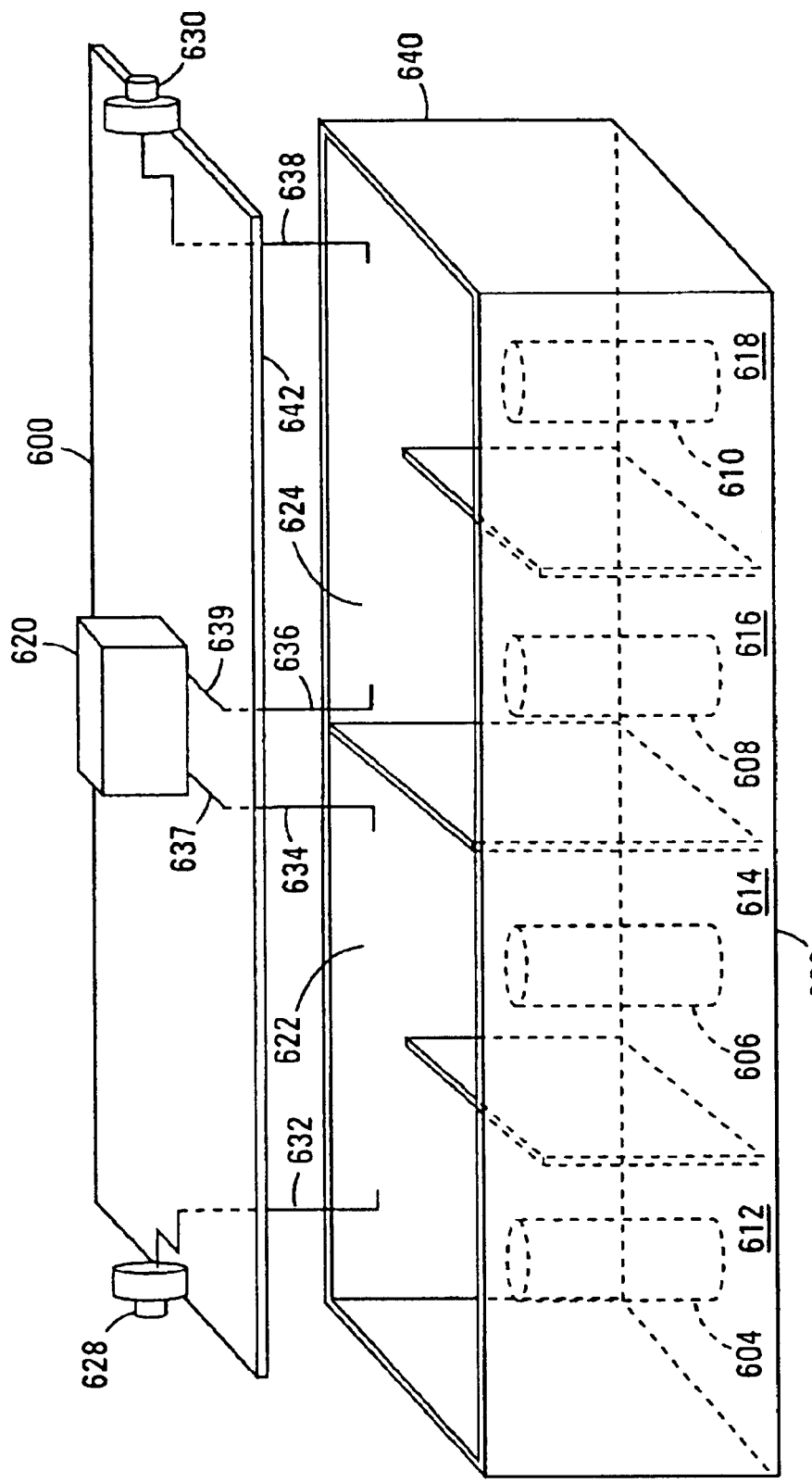

FIG. 6 is a perspective view that represents another embodiment of a filter assembly 640 according to the teachings of the present invention. The filter assembly 640 of FIG. 6 shows an implementation that is functionally divided into two filter stages, first filter stage 622, and second filter stage 624, with a low noise amplifier (LNA) 620 coupling the two stages.

The filter assembly 640 comprises a filter body 602 with cavities 612, 614, 616, and 618, and resonator structures 604, 606, 608, and 610 that are mounted in the filter body 602. The first filter stage 622 includes cavities 612 and 614, and the second filter stage 624 includes cavities 616 and 618. It is noted that in other embodiments, any appropriate number of cavities are included to implement selected filter functions. The filter assembly 640, additionally has a cover 600 that consists of a printed circuit board, PCB 642, on which are mounted input and output connectors 628 and 630. Coupling structures 632, 634, 636, and 638 are mounted to the PCB 642 and descend into the filter body. Coupling structures 632 and 634 descend into the first filter stage 622, and coupling structures 636 and 638 descend into the second filter stage 624. Connectors 628 and 630 are coupled through the PCB 642 to coupling structures 632 and 638. A LNA 620 is mounted to the PCB 642 and coupled via traces 637 and 639 through the PCB 642 to coupling structures 634 and 636.

In operation, the filter assembly 640 acts as two filters coupled with a LNA. The RF signal enters the filter assembly 640 through the input connector 628 and is injected into the first filter stage 622 of the filter body 602 via the input coupling structure 632. The RF signal is extracted from the first filter stage 622 by the coupling structure 634 and amplified by the coupled LNA 620. The amplified RF signal is then injected into the second filter stage 624 by coupling structure 636. The filtered RF signal is extracted from the second filter stage 624 by coupling structure 638 to the coupled output connector 630.

Figure 13:
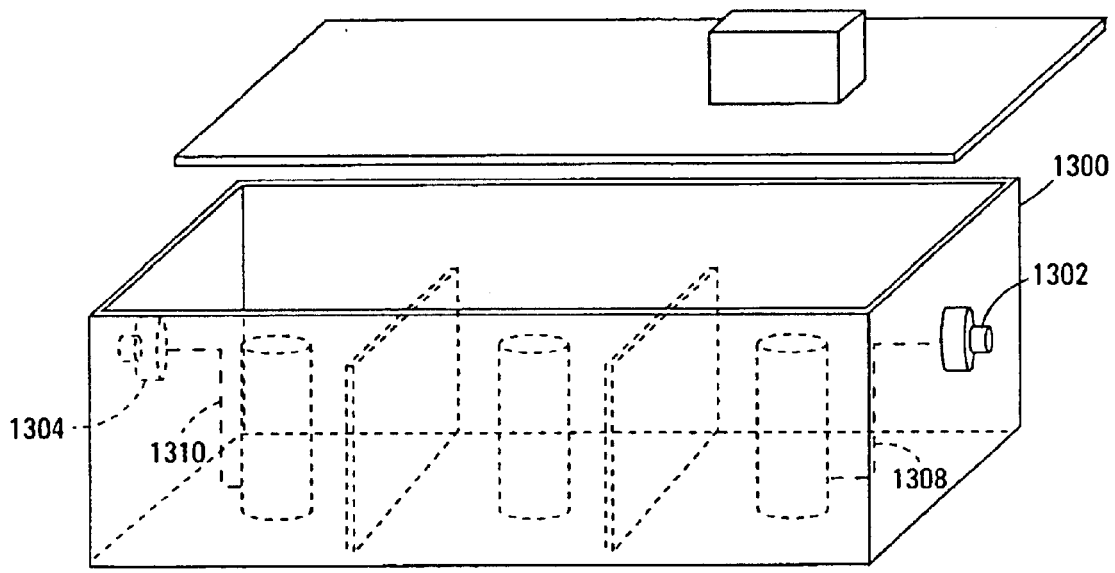
FIG. 13 is a perspective view that represent an embodiment of a cavity filter assembly according to the teachings of the present invention.

FIG. 13 is a perspective view that represents an additional embodiment of a filter assembly 1300 according to the teachings of the present invention with connectors 1302 and 1304 coupled through the filter body 1306 to coupling structures 1308 and 1310.

VI. Filter and Amplifier Configurations

Figure 7:
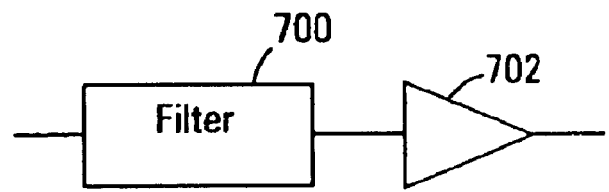
FIGS. 7, 8, 9, and 10 are schematic views that illustrate various embodiments of cavity filters coupled with amplifiers according to the teachings of the present invention.
Figure 8:
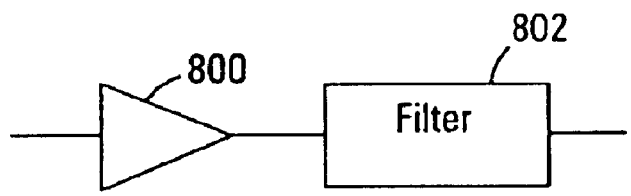
Figure 9:
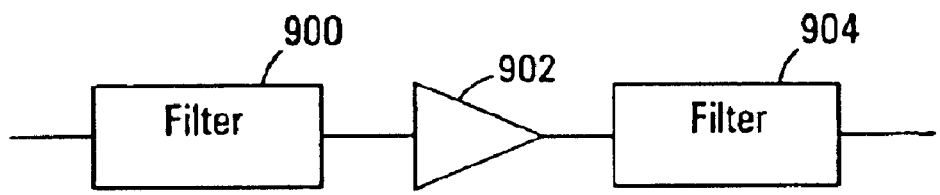
Figure 10:
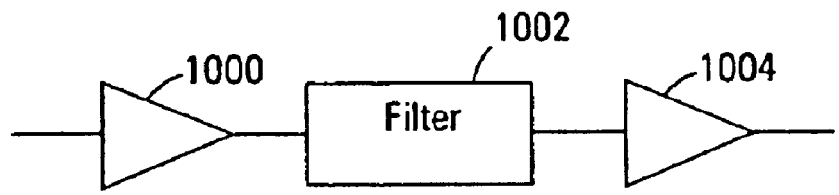

Shown in FIGS. 7, 8, 9 and 10 are schematic diagrams of common filter—amplifier configurations using filter assemblies having a PCB cover with an amplifier attached to the PCB cover. In FIG. 7 is shown an embodiment of a circuit with a filter 700 coupled with an amplifier 702, so that the input RF signal is amplified after it is filtered. Shown in FIG. 8 is a system configuration wherein the amplifier 800 proceeds the filter 802, allowing amplification of the input RF signal before it is filtered. FIG. 9 shows a filter—amplifier—filter arrangement wherein the incoming RF signal is filtered by an initial filter stage 900, then passed through an amplifier stage 902, before passing through a final filter stage 904. A further amplifier—filter—amplifier arrangement is shown in FIG. 10 wherein the incoming RF signal sequentially passes through an amplifier 1000, a filter stage 1002, and then finally an amplifier 1004. Additional such arrangements of filters and amplifiers would be apparent to those skilled in the art.

Figure 12:
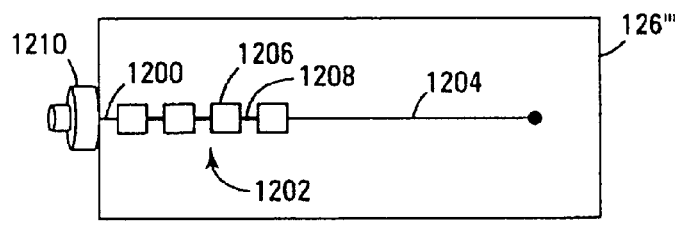
FIG. 12 is a top view of a low pass filter according to the teachings of the present invention.

FIG. 12 is a top view of a portion of a PCB 126''', showing examples of a common type of low pass filter such as would be used in an embodiment of the filter assembly of the present invention. The top view of FIG. 12 includes a signal line 1200 containing a RF signal and a low pass filter 1202. The low pass filter 1202 contains a coupled series of alternating sections of wider circuit traces 1206 and narrower circuit traces 1208 that are formed into the PCB 126'''. The RF signal is coupled from the signal line 1200 to the low pass filter 1202, where it is filtered by the electrical transmission characteristics of the wider and narrower circuit traces, 1206 and 1208. The filtered RF signal is then coupled from the low pass filter 1202 to an output signal line 1204.

The RF signal in FIG. 12 is shown as entering the signal line 1200 through connector 1210, although in other embodiments, the signal is coupled to the signal lines 1200 through a coupling pad, or circuit element, or other such process. Additional such arrangements of filters and amplifiers would be apparent to those skilled in the art.

VII. RF System with Filter

Figure 11:
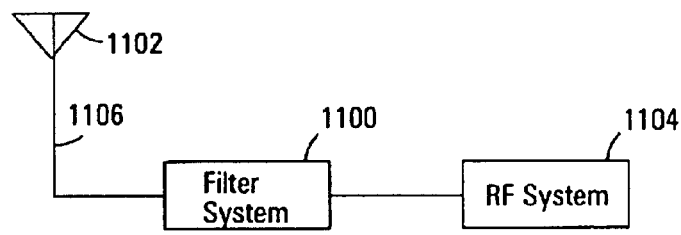
FIG. 11 is a schematic view of a microwave system and antenna incorporating an embodiment of a cavity filter assembly according to the teachings of the present invention.

FIG. 11 is a schematic diagram of a system indicated at 1106 using a filter with a PCB cover according to the teachings of the present invention. In the system 1106, a filter assembly 1100 is coupled with an antenna 1102 and a RF system 1104. The filter assembly 1100 includes a cavity filter body with PCB incorporated to be at least one wall of the filter chamber to allow for circuit elements to be incorporated on the PCB. The circuits that are incorporated into the PCB include, but are not limited to one or more of, an inter-stage coupling circuit, a low noise amplifier, a power amplifier, coupling pads and structures, tuning elements, capacitors, and inductors.

CONCLUSION

Embodiments of the present invention have been described. The embodiments provide a filter assembly with at least one structural cavity wall consisting of a circuit board. The circuit board may also contain other circuits and circuit elements such as trim capacitors, inductors, low noise amplifier circuits and power amplifiers that are part of the filter's function. Other embodiments are also provided that provide input and output coupling structures and connectors on the circuit board. Additional embodiments are provided wherein the circuit board contains inter-stage coupling circuits, signal traces, and coupling pads/structures. Further embodiments are provided that incorporate test connectors and directional couplers on the circuit board. In yet other embodiments the filter's electrical characteristics are tunable with trim elements mounted on the circuit board, such as capacitors or inductors, in either mechanical or electrical manner. The filter's electrical characteristics may also be tunable with mechanical elements mounted through the circuit board.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, multiple circuit boards may be utilized as structural cavity wall elements in a filter. Further, the inter-stage coupling circuits may contain additional circuit elements to alter the electrical characteristics of the inter-stage coupling.

What is claimed is:

1. A filter assembly, comprising:
   an enclosure having a cavity;
   at least one wall of the enclosure comprised of a circuit board;
   a trace formed on the circuit board; and
   at least one circuit element, coupled to the trace; and
   wherein the filter assembly further comprises:
      a first filter stage and a second filter stage formed in the enclosure, wherein the first and second filter stage each have a cavity;
      an input connector attached to the circuit board and coupled to the first filter stage;
      an output coupling structure mounted in the cavity of the first filter stage and coupled to an input of a low noise amplifier;
      an input coupling structure mounted in the cavity of the second filter stage and coupled to an output of the low noise amplifier; and
      an output connector attached to the circuit board coupled to the cavity of the second filter stage.

2. The filter assembly of claim 1, wherein the at least one circuit element further comprises an amplifier.

3. The filter assembly of claim 2, wherein the amplifier is one of a low noise amplifier and a power amplifier.

4. The filter assembly of claim 1, wherein the circuit board comprises an inter-stage coupling circuit, the inter-stage coupling circuit comprising:
   the input coupling structure; and
   the output coupling structure.

5. The filter assembly of claim 4, wherein the inter-stage coupling circuit further comprises a signal trace formed on the circuit board.

6. The filter assembly of claim 5, wherein the signal trace is formed in one of an internal circuit layer of the circuit board and a surface circuit layer of the circuit board.

7. A method of making a filter assembly, comprising:
   forming a cavity body with a cavity and with at least one opening in the cavity body;
   forming a trace on a printed circuit board;
   coupling an electronic component to the trace; and
   covering the at least one opening in the cavity body with the printed circuit board; and
   wherein forming the circuit board further comprises:
      forming a first filter stage and a second filter stage formed in the enclosure, wherein the first and second filter stage each have cavity;
      forming an input connector attached to the circuit board and coupled to the first filter stage;
      forming an output coupling structure mounted in the cavity of the first filter stage and coupled to an input of a low noise amplifier;
      forming an input coupling structure mounted in the cavity of the second filter stage and coupled to an output of the low noise amplifier; and
      forming an output connector attached to the circuit board coupled to the cavity of the second filter stage.

* * * * *